United States Patent [19]

Abdi

[11] Patent Number: 5,467,051
[45] Date of Patent: Nov. 14, 1995

[54] LOW VOLTAGE PRECISION SWITCH

[75] Inventor: Behrooz Abdi, Gilbert, Ariz.

[73] Assignee: Motorola, Inc., Schaumburg, Ill.

[21] Appl. No.: 114,279

[22] Filed: Sep. 1, 1993

[51] Int. Cl.$^6$ .................................................. G05F 1/10
[52] U.S. Cl. .............................. 327/536; 327/63; 327/65; 327/77; 327/108
[58] Field of Search .................................. 327/536, 538, 327/387, 97, 75, 77, 78, 415, 416, 322, 432, 482, 574, 63, 65, 108, 374; 326/60, 53, 75, 126, 32

[56] References Cited

U.S. PATENT DOCUMENTS

| | | | |
|---|---|---|---|
| 4,280,069 | 7/1981 | Kompelien | 327/442 |
| 4,284,911 | 8/1981 | McKeon | 327/432 |
| 4,434,408 | 2/1984 | Baba et al. | 331/111 |
| 4,629,913 | 12/1986 | Lechner | 327/540 |
| 5,124,581 | 6/1992 | Umeki | 324/544 |
| 5,130,573 | 7/1992 | Nawa et al. | 326/126 |
| 5,144,164 | 9/1992 | Sugimoto et al. | 326/109 |
| 5,321,320 | 6/1994 | Collins | 327/170 |
| 5,363,065 | 11/1994 | Dufour | 331/17 |

FOREIGN PATENT DOCUMENTS 0330823  1/1989  European Pat. Off. .

Primary Examiner—Timothy P. Callahan
Assistant Examiner—Kenneth B. Wells
Attorney, Agent, or Firm—Rennie William Dover

[57] ABSTRACT

A current switch circuit for operating with low supply voltages while not compromising dynamic range has been provided. The current switch circuit includes a differential pair of transistors having first (12) and second (20) transistors. The base of the first transistor is coupled to a bias voltage ($V_B$) while its collector is coupled to an output (14) of the current switch circuit. The collector of the second transistor is coupled to a first supply voltage terminal while the base of the second transistor is coupled to a variable bias circuit (22) for alternately swinging the voltage applied to the base of the second transistor above or below the bias voltage applied to the base of the first transistor. When the voltage applied to the base of the second transistor is greater than the bias voltage applied to the base of the first transistor, a predetermined current is sunk from the output of the current switch. Otherwise, substantially zero current flows at the output of the current switch.

6 Claims, 3 Drawing Sheets

LOW VOLTAGE PRECISION SWITCH

FIELD OF THE INVENTION

This invention relates to current switch circuits and, in particular but not limited to, current switch circuits for operating at low supply voltages while not compromising dynamic range.

BACKGROUND OF THE INVENTION

Current switch circuits may be utilized in a plurality of applications, for example, in charge pumps for use in phase locked loops and delay locked loops. Typical current switch circuits include an N-type differential transistor pair with a known current being steered out of an output wherein this output may then be coupled to drive a loop filter. In general, the dynamic range of the charge pump is limited by the current switch wherein the dynamic range is limited by the differential transistor pair non-linearity (i.e. saturation). This typically amounts to approximately a three $V_{BE}$ voltage limitation. Thus, the dynamic range of typical current switch circuits have limitations for low operating supply voltages.

In order to combat this problem when operating in a phase locked loop application, the voltage controlled oscillator on the other side of the loop filter needs to have a high gain in order for the phase locked loop to cover a large frequency span. However, this increases the noise sensitivity of the system.

Hence, there exists a need for an improved current switch circuit for operating at low supply voltages while not compromising dynamic range.

DETAILED DESCRIPTION OF THE DRAWINGS

Figure 1:
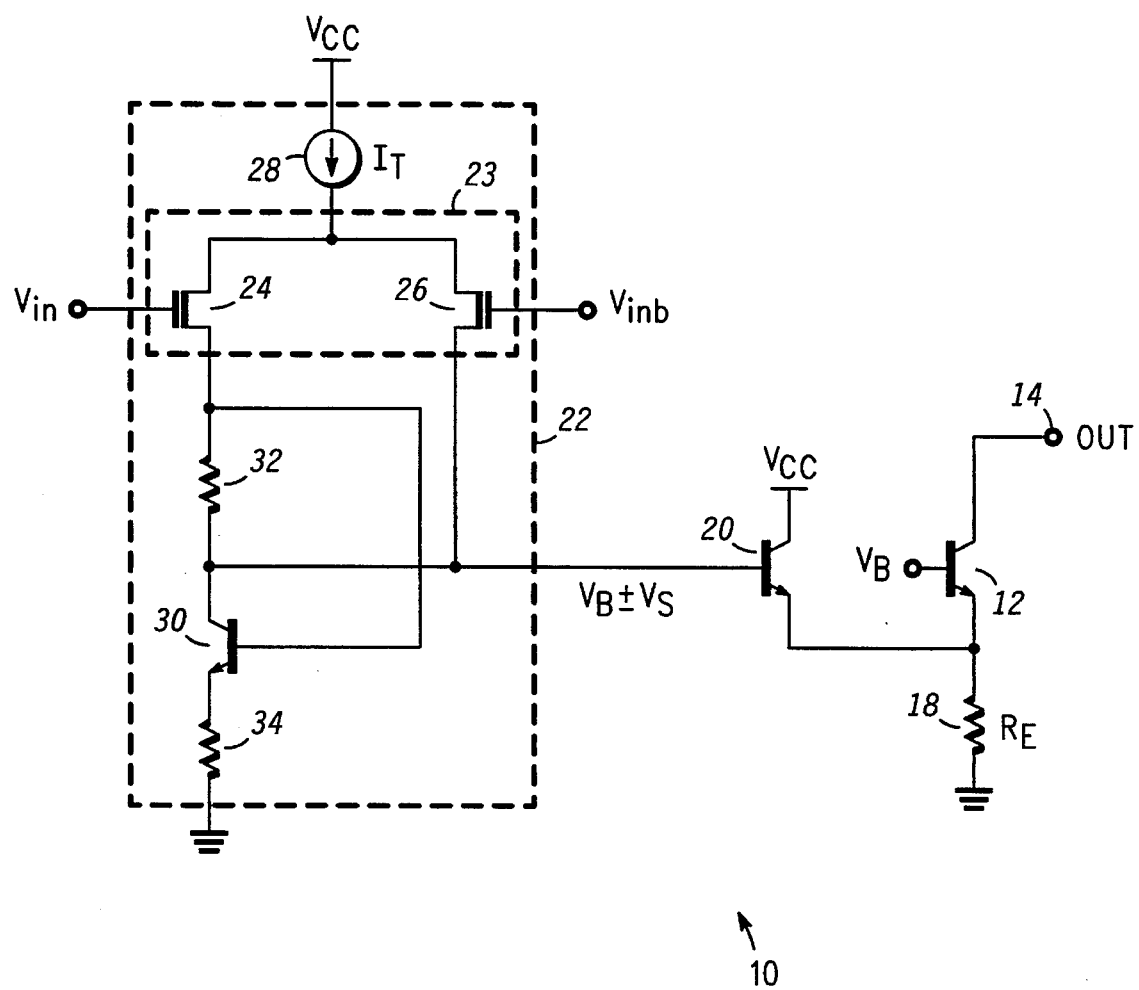
FIG. 1 illustrates a detailed schematic diagram of a first embodiment of a current switch circuit in accordance with the present invention.

Referring to FIG. 1, current switch circuit 10 is shown. Current switch 10 includes differential transistor pair 12 and 20 wherein transistor 12 has a collector coupled to output terminal 14. The base of transistor 12 is coupled to receive bias voltage $V_B$ wherein bias voltage $V_B$ may be either a DC or an AC voltage. The emitter of transistor 12 is coupled through resistor 18 ($R_E$) and returned to ground. Further, the emitter of transistor 12 is coupled to the emitter of transistor 20, the latter having a collector coupled to the first supply voltage terminal.

The base of transistor 20 is coupled to variable bias circuit 22 for alternately switching the voltage applied at the base of transistor 20 from voltage $(V_B+V_S)$ to voltage $(V_B-V_S)$.

Bias circuit 22 includes switching circuit 23 which may take the form of a differential transistor pair including PMOS transistors 24 and 26 each having their source electrodes coupled through current source 28 to the first supply voltage terminal. Although current source 28 is shown as providing a current of value $I_T$, it is understood that current source 28 may provide a reduced current of $I_T/N$ where N is an integer greater than one. This will have no effect on the operation of current switch 10 provided that the resistors 32 and 34 are appropriately scaled, but the overall power dissipation of current switch 10 can be substantially reduced.

The gate electrodes of PMOS transistors 24 and 26 are respectively coupled to receive complementary signals $V_{in}$ and $V_{inb}$. The drain electrode of PMOS transistor 26, which represents an output of bias circuit 22, is coupled to the base of transistor 20, and to the collector of transistor 30. Transistor 30 has a base coupled to the drain electrode of PMOS transistor 24. Resistor 32 is coupled between the drain electrode of transistor 24 and the collector of transistor 30. The emitter of transistor 30 is coupled through resistor 34 and returned to ground.

In operation, bias circuit 22 generates a precision current $I_T$, for example, via a current mirror, which is switched between transistors 24 and 26. In response to the switched current, a switching voltage is generated at the base of transistor 20 which in turn generates a current at terminal 14. This current is alternately switched on and off at terminal 14 depending upon the voltage applied at the base of transistor 20 (which is set by the logic states of voltages $V_{in}$ and $V_{inb}$). That is, when the voltage at the base of transistor 20 is pulled above bias voltage $V_B$ by the amount $V_S$, wherein voltage $V_S$ is a voltage sufficiently large enough to cause transistor pair 12 and 20 to switch, transistor 20 is rendered operative while transistor 12 is rendered non-operative. Transistor 20 then functions to steal current away from transistor 12 thereby providing substantially zero current at output terminal 14.

However, if a voltage of $(V_B-V_S)$ is applied to the base of transistor 20, transistor 20 is rendered non-operative while transistor 12 is rendered operative. Then, transistor 20 does not steal current away from transistor 12. Thus, transistor 12 is on since voltage $V_B$ is such that current $I_T$ flows through transistor 12 and transistor 12 functions to sink a net current substantially equal to $I_T$ from terminal 14. In the above described manner, current $I_T$ is alternately switched on and off at terminal 14. It should be understood by those skilled in the art that the voltage $V_S$ is a design choice, wherein the value is selected such that transistor 20 and bias circuit 22 remain operational. In other words, $V_S$ is selected such that the quantity $(V_B+V_S)$ does not place transistors 24 and 26 in the cut-off mode of operation and such that the quantity $(V_B-V_S)$ does not place transistors 20 and 30 in the cut-off mode of operation.

Bias circuit 22 alternately supplies either voltage $(V_B+V_S)$ or voltage $(V_B-V_S)$ to the base of transistor 20. If voltage $V_{in}$ is greater than voltage $V_{inb}$, then bias circuit 22 provides voltage $(V_B+V_S)$ to the base of transistor 20. Alternatively, if voltage $V_{in}$ is less than voltage $V_{inb}$, then bias circuit 22 supplies voltage $(V_B-V_S)$ to the base of transistor 20.

In more detail, if voltage $V_{in}$ is greater than voltage $V_{inb}$, all of current $I_T$ flows through transistor 26 and then through transistor 30 and resistor 34. By choosing the value of resistor 34 to be substantially equal to $(R_E+V_S/I_T)$, then the voltage appearing at the base of transistor 20 is substantially equal to the expression shown in equation 1.

$$V_{B20}=(I_T R_E+V_{BE30}+V_S) \text{ for } V_{in}>V_{inb} \qquad \text{EQN. 1}$$

where $R_E$ is the value of resistor 18;

$V_{BE30}$ is the base-emitter voltage of transistor 30; and $V_S$ is a predetermined voltage.

It should be recognized that the first two terms on the right side of EQN. 1 are substantially equal to bias voltage $V_B$ assuming that the base emitter voltages of transistors 12 and 30 are substantially equal. As a result, the voltage applied at the base of transistor 20, for $V_{in} > V_{inb}$, is greater than bias voltage $V_B$ by the term $V_S$. Therefore, transistor 20 is rendered operative and steals all current away from transistor 12 and substantially zero current flows at output terminal 14.

However, when voltage $V_{in}$ is less than voltage $V_{inb}$ and when resistor 32 is substantially equal to the value of 2 $V_S/I_T$, switching circuit 23 now routes the current via current source 28 through transistor 24 and the voltage appearing at the base of transistor 20 can be expressed as shown in equation 2.

$$V_{B20} = (I_T R_E + V_{BE30} - V_S) \text{ for } V_{in} < V_{inb} \quad \text{EQN. 2}$$

From equation 2, it should be apparent that the voltage appearing at the base of transistor 20, for voltage $V_{in}$ less than voltage $V_{inb}$, is substantially equal to voltage $(V_B - V_S)$. As a result, transistor 20 is rendered non-operative and does not steal current away from transistor 12. Thus, transistor 12 is on and functions to sink current $I_T$ from output terminal 14. The current flowing at output terminal 14 of current switch 10 with respect to input signals $V_{in}$ and $V_{inb}$ can be expressed in truth table form as shown in Table 1 wherein it is understood that if $V_{in} > V_{inb}$, then $V_{in} = 1$ and $V_{inb} = 0$ and wherein if $V_{in} < V_{inb}$, then $V_{in} = 0$ and $V_{inb} = 1$.

TABLE 1

| Output current of current switch 10 with respect to input voltages $V_{in}$ and $V_{inb}$. | | | |
|---|---|---|---|
| $V_{in}$ | $V_{inb}$ | $V_{B20}$ | $I_{14}$ ($I_{OUT}$) |
| 1 | 0 | $V_B + V_S$ | ZERO |
| 0 | 1 | $V_B - V_S$ | $I_T$ SUNK |

Current switch 10 is advantageous over other current switches because current is switched through transistor 12 by controlling the voltage at the base of transistor 20 and there is no need for an additional transistor coupled between the common emitters of transistors 12 and 20 and resistor 18. As a result, the present invention eliminates one $V_{BE}$ voltage and increases the dynamic range of current switch 10 and further allows current switch 10 to operate efficiently at lower voltages.

Figure 2:
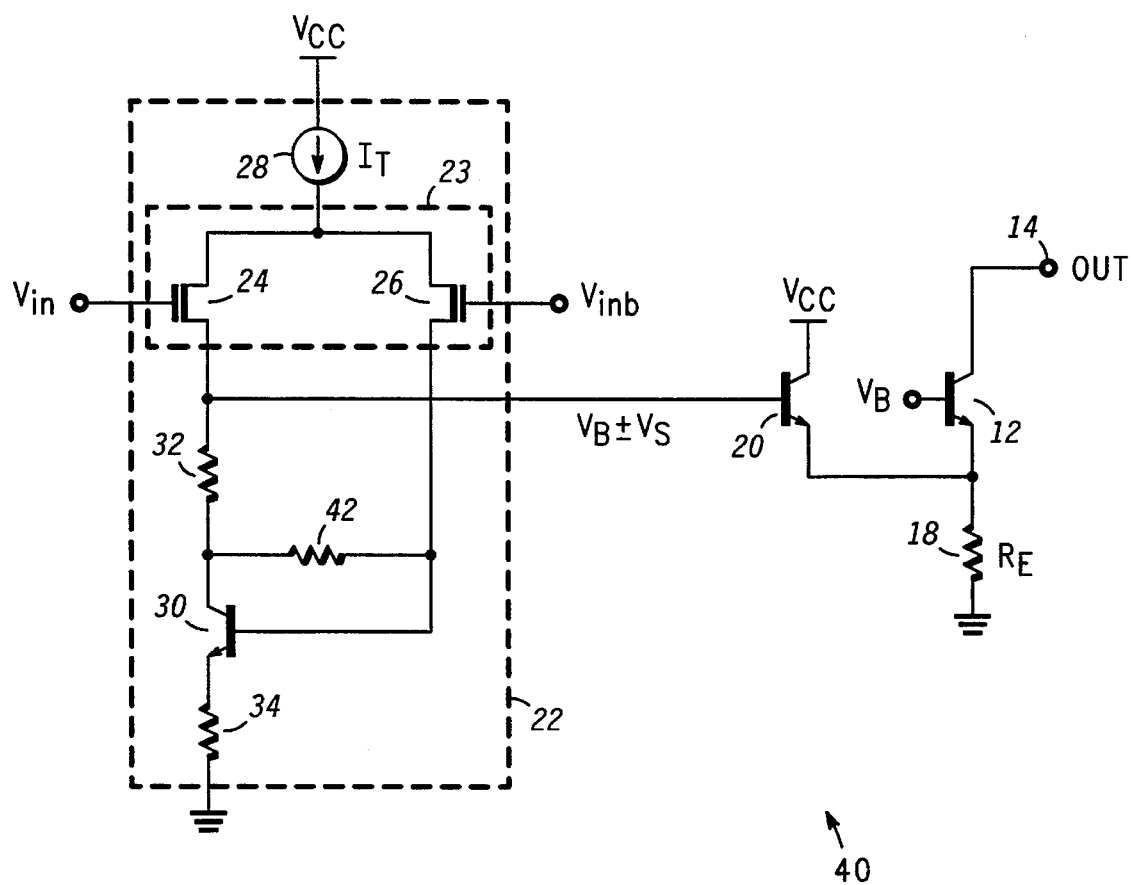
FIG. 2 illustrates a detailed schematic diagram of a second embodiment of a current switch circuit in accordance with the present invention.

Referring to FIG. 2, a detailed schematic of current switch 40 is shown. It is understood that the components shown in FIG. 2 which are identical to components shown in FIG. 1 are identified by the same reference numbers. The circuit shown in FIG. 2 further includes resistor 42 coupled between the base and collector of transistor 30. In addition, although variable bias circuit 22 of FIG. 2 performs the same function as does its FIG. 1 counterpart (which is to provide either voltage $V_B + V_S$ or voltage $V_B - V_S$ at the base of transistor 20), variable bias circuit 22 of FIG. 2 differs slightly from variable bias circuit 22 of FIG. 1. First, the base of transistor 20 is coupled to the drain electrode of transistor 24. Second, the drain electrode of transistor 26 is coupled to the base of transistor 30. Third, the values for resistors 32 and 34 of FIG. 2 are respectively $V_S/I_T$ and $R_E$. Also, the value for resistor 42 is $V_S/I_T$. By choosing these values, if $V_{in} > V_{inb}$, then bias circuit 22 provides voltage $(V_B - V_S)$ at the base of transistor 20. However, if $V_{in} < V_{inb}$, then bias circuit 22 provides voltage $(V_B + V_S)$ at the base of transistor 20.

The current flowing at output terminal 14 of current switch 40 with respect to input signals $V_{in}$ and $V_{inb}$ can be expressed in truth table form as shown in Table 2.

TABLE 2

| Output current of current switch 40 with respect to input voltages $V_{in}$ and $V_{inb}$. | | | |
|---|---|---|---|
| $V_{in}$ | $V_{inb}$ | $V_{B20}$ | $I_{14}$ ($I_{OUT}$) |
| 1 | 0 | $V_B - V_S$ | $I_T$ SUNK |
| 0 | 1 | $V_B + V_S$ | ZERO |

Figure 3:
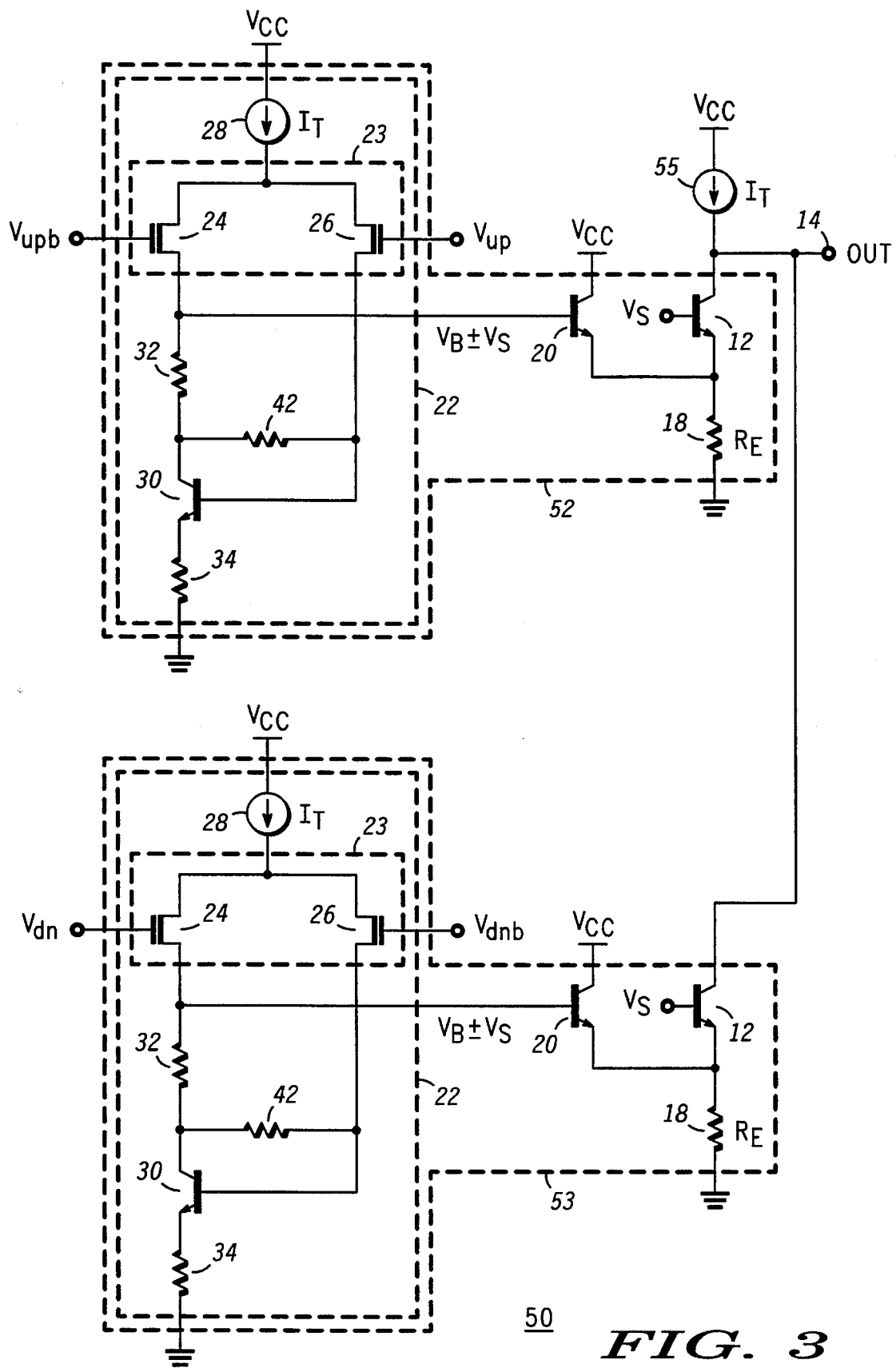
FIG. 3 illustrates a detailed schematic diagram of a charge pump circuit utilizing the current switch circuit shown in FIG. 2.

Referring to FIG. 3, a detailed schematic diagram of charge pump circuit 50 is shown. Charge pump circuit 50 includes two current switches 52 and 53 that are identical to current switch 40 of FIG. 2 wherein it is understood that the components shown in FIG. 3 which are identical to components shown in FIG. 2 are identified by the same reference numbers. Further, it is understood that charge pump circuit 50 could have been formed by utilizing two current switch circuits as shown in FIG. 1. Charge pump circuit 50 also includes current source 55 coupled between the first supply voltage terminal and output terminal 14 for providing current $I_T$.

In particular, charge pump circuit 50 includes current switch 52 which is responsive to input signals $V_{up}$ and $V_{upb}$ for alternately sinking current $I_T$ or zero current from terminal 14. That is, if voltage $V_{up} < V_{upb}$, then current switch 52 sinks current $I_T$ from terminal 14. Alternately, if voltage $V_{up} > V_{upb}$, then current switch 52 sinks substantially zero current from terminal 14.

Similarly, charge pump circuit 50 includes current switch 53 which is responsive to input signals $V_{dn}$ and $V_{dnb}$ for alternately sinking current $I_T$ or zero current from terminal 14. That is, if voltage $V_{dn} > V_{dnb}$, then current switch 53 sinks current $I_T$ from terminal 14. Alternatively, if voltage $V_{dn} < V_{dnb}$, then current switch 53 sinks substantially zero current from terminal 14.

Moreover, with the addition of current source 55 along with current switch circuits 52 and 53, charge pump circuit 50 is capable of either (i) sourcing current $I_T$ to terminal 14, (ii) sinking current $I_T$ from terminal 14, or (iii) or providing a net current substantially equal to zero flowing at terminal 14.

The current flowing at output terminal 14 with respect to signals $V_{up}/V_{upb}$ and $V_{dn}/V_{dnb}$ can be expressed in truth table form as shown in Table 3.

TABLE 3

| Output current for charge pump circuit 50 with respect to input voltages $V_{up}$ and $V_{dn}$. | | |
|---|---|---|
| $V_{up}/V_{upb}$ | $V_{dn}/V_{dnb}$ | $I_{14}$ ($I_{OUT}$) |
| 0/1 | 0/1 | ZERO |
| 0/1 | 1/0 | $I_T$ SUNK |
| 1/0 | 0/1 | $I_T$ SOURCED |
| 1/0 | 1/0 | ZERO |

By now it should be apparent from the foregoing discussion that a novel current switch circuit for operating with low supply voltage while not compromising the dynamic range has been provided. The current switch circuit includes a differential pair of transistors having first and second transistors. The base of the first transistor is coupled to a bias voltage while its collector is coupled to an output of the current switch circuit. The collector of the second transistor is coupled to a first supply voltage terminal while the base of the second transistor is coupled to a variable bias circuit for alternately swinging the voltage applied to the base of the second transistor above or below the bias voltage applied to the base of the first transistor. When the voltage applied to the base of the second transistor is less than the bias voltage applied to the base of the first transistor, a predetermined current is sunk from the output of the current switch. Otherwise, substantially zero current flows at the output of the current switch.

While the invention has been described in specific embodiments thereof, it is evident that many alterations, modifications and variations will be apparent to those skilled in the art. Further, it is intended to embrace all such alterations, modifications and variations in the appended claims.

I claim:

1. A current switch circuit having an output terminal, comprising:

a differential pair of transistors having first and second transistors each having a collector, a base, and an emitter, said emitter of said first transistor coupled to said emitter of said second transistor, said base of said first transistor coupled for receiving a bias voltage, said collector of said first transistor serving as the output terminal of the current switch circuit, said collector of said second transistor coupled to first supply voltage terminal;

a first resistor coupled between said emitter of said first transistor and a second supply voltage terminal; and a bias circuit for alternately providing first and second voltages at said base of said second transistor, said bias circuit having an output node coupled to said base of said second transistor, said first transistor being operative and said second transistor being non-operative when said first voltage is greater than said bias voltage and said second transistor being operative and said first transistor being non-operative when said second voltage is less than said bias voltage, wherein said bias circuit includes:

a current source;

a first switch having first and second inputs responsive to a complementary pair of input signals for steering a current provided by said current source to either a first output or a second output of said first switch;

a third transistor having a collector, a base and an emitter, said base of said third transistor coupled to said first output of said first switch, said collector of said third transistor coupled to said second output of said first switch and to said output of said bias circuit;

a second resistor coupled between said first output of said first switch and said collector of said third transistor; and a third resistor coupled between said emitter of said third transistor and said second supply voltage terminal.

2. The current switch circuit according to claim 1 wherein said first switch includes:

a fourth transistor having first and second current carrying electrodes and a control electrode, said first current carrying electrode of said fourth transistor coupled to said first output of said first switch, said second current carrying electrode of said fourth transistor coupled to said current source, said control electrode of said fourth transistor coupled for receiving a first one of said complementary input signals; and a fifth transistor having first and second current carrying electrodes and a control electrode, said first current carrying electrode of said fifth transistor coupled to said second output of said first switch, said second current carrying electrode of said fifth transistor coupled to said current source, said control electrode of said fifth transistor coupled for receiving a second one of said complementary input signals.

3. A current switch circuit having an output terminal, comprising:

a differential pair of transistors having first and second transistors each having a collector, a base and an emitter, said emitter of said first transistor coupled to said emitter of said second transistor, said base of said first transistor coupled for receiving a bias voltage, said collector of said first transistor coupled to the output of the current switch circuit, said collector of said second transistor coupled to a first supply voltage terminal;

a first resistor coupled between said emitter of said first transistor and a second supply voltage terminal; and a bias circuit for alternately providing first and second voltages at said base of said second transistor, said bias circuit having an output coupled to said base of said second transistor, said first voltage being greater than said bias voltage thereby rendering said second transistor operative and said first transistor non-operative, said second voltage being less than said bias voltage thereby rendering said first transistor operative and said second transistor non-operative, wherein said bias circuit includes:

a current source;

a first switch having first and second inputs responsive to said first complementary pair of input signals for steering a current provided by said current source to either a first output or a second output of said first switch, said first output of said first switch coupled to said output of said bias circuit;

a third transistor having a collector, a base and an emitter, said base of said third transistor coupled to said second output of said first switch;

a second resistor coupled between said first output of said first switch and said collector of said third transistor;

a third resistor coupled between said emitter of said third transistor and said second supply voltage terminal; and a fourth resistor coupled between said base and collector of said third transistor.

4. A charge pump circuit having an output, the charge pump circuit including a current source coupled between a first supply voltage terminal and the output, the charge pump circuit further comprising:

first and second current switch circuits, each one of said current switch circuits including:

a differential pair of transistors having first and second transistors each having a collector, a base and an emitter, said emitter of said first transistor coupled to said emitter of said second transistor, said base of said first transistor coupled for receiving a bias voltage, said collector of said first transistor coupled to the output of the charge pump circuit, said collector of said second transistor coupled to first supply voltage terminal;

a first resistor coupled between said emitter of said first transistor and a second supply voltage terminal; and a bias circuit responsive to an input signal for alternately providing first and second voltages at said base of said second transistor, said bias circuit having an output coupled to said base of said second transistor, said first voltage being greater than said bias voltage thereby rendering said second transistor operative and said first transistor non-operative, said second voltage being less than said bias voltage thereby rendering said first transistor operative and said second transistor non-operative, the charge pump circuit capable of sourcing or sinking a predetermined current at the output of the charge pump circuit or providing substantially zero current at the output of the charge pump circuit, wherein said bias circuit includes:

a current source;

a first switch having first and second inputs responsive to said input signal for steering a current provided by said current source to either a first output or a second output of said first switch, said first output of said first switch coupled to said output of said bias circuit;

a third transistor having a collector, a base and an emitter, said base of said third transistor coupled to said second output of said first switch;

a second resistor coupled between said first output of said first switch and said collector of said third transistor;

a third resistor coupled between said emitter of said third transistor and said second supply voltage terminal; and a fourth resistor coupled between said base and collector of said third transistor.

5. The charge pump circuit according to claim 4 wherein said first switch includes:

a fourth transistor having first and second current carrying electrodes and a control electrode, said first current carrying electrode of said fourth transistor coupled to said first output of said first switch, said second current carrying electrode of said fourth transistor coupled to said current source, said control electrode of said fourth transistor coupled for receiving said input signal; and a fifth transistor having first and second current carrying electrodes and a control electrode, said first current carrying electrode of said fifth transistor coupled to said second output of said first switch, said second current carrying electrode of said fifth transistor coupled to said current source, said control electrode of said fifth transistor coupled for receiving a complement of said input signal.

6. A method for switching current at an output terminal, the method comprising the steps of:

providing a bias voltage at a base of a first transistor, said first transistor having a collector coupled to the output terminal and a second supply voltage terminal coupled to an emitter of said first transistor by a first resistor, said bias voltage comprising a sum of a voltage at said second supply voltage terminal, a voltage across said first resistor, and a voltage from the emitter to the base of said first transistor;

producing a variable voltage at a base of a second transistor, said second transistor having a collector coupled to a first supply voltage terminal wherein current is sunk from the output terminal when said variable voltage is less than said bias voltage and wherein substantially zero current flows at the output terminal when said variable voltage is greater than said bias voltage, and wherein producing said variable voltage includes producing a first voltage by:

routing a current through a third transistor which has an emitter coupled to said second supply voltage by a second resistor, said first voltage comprising the sum of a voltage at said second supply voltage terminal, voltage across said second resistor, and a voltage from the emitter to the base of said third transistor, the voltage across said second resistor being formed in accordance with the current which flows through said second resistor and being greater than said voltage across said first resistor by an amount $V_S$, wherein the current flowing through said first and second resistors is substantially equal and said voltage from the emitter to the base of said third transistor being substantially equal to the voltage from the emitter to the base of said first transistor; and wherein producing said variable voltage includes producing a second voltage by:

routing the current through said third transistor, said second resistor, and a third resistor, said third resistor coupled to a collector of said third transistor and serving to reduce said first voltage by an amount of substantially double the amount of the voltage $V_S$ to form said second voltage.

\* \* \* \* \*